(12) United States Patent
Wießmann et al.

(10) Patent No.: US 11,939,980 B2
(45) Date of Patent: Mar. 26, 2024

(54) ELECTRONIC UNIT AND ELECTRIC FLUID PUMP, AND CLOSURE ELEMENT

(71) Applicant: Brose Fahrzeugteile SE & Co. Kommanditgesellschaft, Würzburg, Würzburg (DE)

(72) Inventors: Nico Wießmann, Kitzingen (DE); Peter Sudermann, Schwarzenau (DE); Stephan Roos, Wertheim-Höhefeld (DE); Christian Schumpa, Großlangheim (DE); Fabian Müller, Würzburg (DE); Hans-Jürgen Geßner, Hettstadt (DE)

(73) Assignee: Brose Fahrzeugteile SE & Co. Kommanditgesellschaft, Würzburg (DE)

( * ) Notice: Subject to any disclaimer, the term of this patent is extended or adjusted under 35 U.S.C. 154(b) by 720 days.

(21) Appl. No.: 17/053,264

(22) PCT Filed: May 3, 2019

(86) PCT No.: PCT/EP2019/061388
§ 371 (c)(1),
(2) Date: Nov. 5, 2020

(87) PCT Pub. No.: WO2019/215036
PCT Pub. Date: Nov. 14, 2019

(65) Prior Publication Data
US 2021/0285534 A1 Sep. 16, 2021

(30) Foreign Application Priority Data
May 8, 2018 (DE) ..................... 10 2018 207 120.9

(51) Int. Cl.
F04D 13/06 (2006.01)
F16H 57/04 (2010.01)
(Continued)

(52) U.S. Cl.
CPC ..... *F04D 13/0686* (2013.01); *F16H 57/0436* (2013.01); *H02K 11/30* (2016.01); *H05K 5/0221* (2013.01); *H05K 5/03* (2013.01)

(58) Field of Classification Search
CPC ............ F04D 13/0686; H01R 13/5202; H01R 13/521; H02K 5/0221; H02K 5/03; H02K 9/227; H02K 11/30; H02K 11/33
(Continued)

(56) References Cited

U.S. PATENT DOCUMENTS 3,772,453 A * 11/1973 O'Brien ................. H02K 5/132
310/71
4,675,987 A 6/1987 Minks et al.
(Continued)

FOREIGN PATENT DOCUMENTS

CN 103883534 A 6/2014
CN 204885619 U 12/2015
(Continued)

Primary Examiner — Kenneth J Hansen
(74) Attorney, Agent, or Firm — Dickinson Wright PLLC

(57) ABSTRACT

An electronic unit, in particular for an electric fluid pump of a motor vehicle, having a functional element for holding electronics, and a heat sink arranged on the functional element, wherein the functional element and the heat sink are sealed from one another in fluid-tight fashion by means of a cured sealing compound of a liquid seal, and wherein the functional element has at least one ventilation opening, which is open in the course of a curing process for the sealing compound, and which, after the curing process, is sealed in fluid-tight fashion by means of a closure element.

19 Claims, 11 Drawing Sheets

(51) Int. Cl.
*H02K 11/30* (2016.01)
*H05K 5/02* (2006.01)
*H05K 5/03* (2006.01)

(58) Field of Classification Search
USPC .......................................................... 361/709
See application file for complete search history.

(56) References Cited

U.S. PATENT DOCUMENTS

| | | | |
|---|---|---|---|
| 2004/0188121 A1 | 9/2004 | Ricco et al. | |
| 2015/0357886 A1 | 12/2015 | Ishizeki et al. | |
| 2018/0254685 A1* | 9/2018 | Seki | F04C 13/001 |
| 2019/0380220 A1* | 12/2019 | Matsuda | H01R 13/41 |

FOREIGN PATENT DOCUMENTS

| | | |
|---|---|---|
| CN | 107078487 A | 8/2017 |
| JP | 2014122554 A | 7/2014 |

* cited by examiner

ELECTRONIC UNIT AND ELECTRIC FLUID PUMP, AND CLOSURE ELEMENT

CROSS-REFERENCE TO RELATED APPLICATIONS

This application is the U.S. National Phase of PCT Application No. PCT/EP2019/061388 filed on May 3, 2019, which claims priority to German Patent Application No. DE 10 2018 207 120.9, filed on May 8, 2018, the disclosures of which are hereby incorporated in their entirety by reference herein.

TECHNICAL FIELD 1000.41 The present disclosure relates to an electronic unit for use in an electric fluid pump for a motor vehicle.

BACKGROUND

An electric fluid pump serves to convey a fluid within a fluid circuit. An oil pump and in particular a so-called auxiliary or supplementary pump serves in this instance to convey oil as a lubricant and as a transmission member in a hydraulic switching circuit for in particular moving parts or components, for example, also of a vehicle (motor vehicle) which is driven with a combustion engine, using hybrid technology or electrically. Such an oil pump generally produces as a result of the conveying properties thereof an oil circuit, for example, with an oil sump for receiving excess oil and/or leakage oil. An auxiliary or supplementary pump which is driven, for example, electrically or in an electromotive manner is often used for at least occasional lubrication or additional lubrication of gear components of a vehicle transmission, in particular an automatic transmission. The conveyed oil is also often used in this instance to cool components or additional components of the drive train of such a vehicle.

For control and regulation, such an oil pump generally comprises a pump electronic assembly or motor electronic assembly. This electronic assembly has, for example, inter alia an electronic circuit, sensors and/or an electronic connection to a cable harness of the vehicle. The electronic assembly is appropriately installed within an electronic unit of the oil pump.

In a typical installation situation, the electronic unit—and consequently the electronic assembly—is arranged together with the oil pump in the oil sump of the vehicle transmission. In this instance, the electronic unit is located completely or at least partially directly in the oil. Such electronic housings are consequently intended to be configured or structurally designed for relatively large temperature ranges. The relatively high temperatures which occur during operation may in this instance have a damaging effect on the electronic components and the function of the electronic unit.

The electronic unit has, for example, an electronic assembly or function carrier for retaining the electronic assembly. In this instance, the function carrier is, for example, constructed as an injection-molded component. In order to protect the electronic assembly and in order to cool it at higher temperatures, a cooling member is provided as a heat sink. The cooling member is in this instance, for example, coupled to the function carrier in the manner of a cover so that the function carrier and the cooling member in the joined state substantially form a closed electronic housing for the electronic assembly.

Such electrical oil pumps are intended to be configured or structurally designed for relatively large temperature ranges. The temperature range which has to be controlled or taken into account is often between, for example, −40° C. and, for example, 130° C. It should also be taken into account in this instance that the lubricant used (oil) has a given or specific viscosity which is temperature-dependent and which in this case decreases as the temperature increases, that is to say, is greater at lower temperatures than at higher temperatures. Furthermore, the lubricant or oil used may have aggressive additives which attack and may damage the electronic assembly.

Particularly at higher operating temperatures or at temperatures which increase as a result of the operation, therefore, the risk of leakages also increases. The reason for this is that, on the one hand, the prevention of leakages requires a correspondingly fluid-tight electronic assembly whilst, on the other hand, as a result of the high temperature fluctuations, housing expansions, that is to say, different expansions of the function carrier and/or the cooling member as the temperatures increase and viscosity of the oil or lubricant used consequently decreases, increase the tendency for leakages, which at low temperatures and consequently high viscosity of the oil or the lubricant tend to be comparatively less evident. In a disadvantageous manner, pressure changes of the air enclosed in the electronic unit increase such tendencies for leakages so that high mechanical demands are placed on the fluid-tightness of the electronic unit.

SUMMARY

One or more objects of the present disclosure may be to provide an electronic unit that includes an improved fluid seal. Such an electronic unit may be used in an electric fluid pump.

The electronic unit according to one or more embodiments may be suitable and configured for an electric fluid pump of a motor vehicle, such as an oil pump of a motor vehicle transmission. The electronic unit has a function carrier for retaining an electronic assembly, for example, a motor or pump electronic assembly of the fluid pump, and a cooling member which is arranged on the function carrier. The function carrier is, for example, constructed as an injection-molded component from a plastics material on which the electronic assembly is arranged, or at least partially integrated therein. The cooling member or cooling cover is, for example, constructed as a metal die-cast component, for example, of an aluminum material, and may have a higher thermal conductivity than the function carrier.

In order to join and seal the function carrier in a fluid-tight manner with respect to the cooling member, a fluid seal is provided. To this end, a sealing compound (grouting) of the fluid seal which is formed, for example, as an adhesive is applied to the contact or abutment faces of the cooling member which face each other and/or the function carrier. The conjunction "and/or" is intended to be understood in this instance and below to mean that the features combined using this conjunction may be formed both together and as alternatives to each other.

In the joined state, the sealing compound is hardened, whereby the function carrier and the cooling member are adhesively bonded to each other and sealed with respect to each other in a fluid-tight manner. That is to say, the hardened sealing compound forms a fluid-tight material engagement between the function carrier and the cooling member. In contrast to sealing rings (O-ring) or molded component seals, such a fluid seal requires comparatively few operating steps, whereby lower set-up times during the production of the electronic unit and less rejects are brought about.

In order to ensure a complete hardening of the sealing compound during a hardening process, there is provision according to the invention for the function carrier to have at least one ventilation opening. The ventilation opening (ventilation channel) is in this instance constructed as a through-opening or through-hole, through which the function carrier extends from an (inner) face which faces the cooling member and which in the joined state opens at the inner side of the electronic unit, to an opposing (outer) face. The ventilation opening is open during the hardening process, this means that the electronic unit is not completely closed during the hardening process.

In order to completely seal the electronic unit in a fluid-tight manner and in order to prevent leakages, there is provision for the ventilation opening after the hardening process to be closed in a fluid-tight manner with a closure element. A complete fluid-tight sealing of the electronic unit is intended in this instance may be understood as a gas-tight closure of the electronic unit so that in normal operating situations no fluid penetrates inside the electronic unit. The closure element which is mounted or used may include a seal that may provide an air leakage rate of less than or equal to 0.1 mbar l/s (millibar liter per second) and may seal gear oil. As an example, the closure element is located in this instance substantially completely in the ventilation opening. In this instance, for example, it is conceivable for the ventilation opening to be provided with a chamfered introduction member by means of which the closure element can be inserted into the ventilation opening in a particularly simple manner.

As a result of the ventilation opening of the function carrier, a thermally hardenable sealing compound or fluid seal that may be formed of sealing compound that hardens fully and completely during the hardening process to the greatest possible extent. A relatively stable, operationally reliable and fluid-tight material engagement between the function carrier and the cooling member may be provided. The subsequent fluid-tight closure of the ventilation opening produces a completely closed electronic unit, in which the electronic assembly is enclosed in a fluid-tight manner. A suitable electronic unit, such as for an oil pump which is at least partially located in an oil sump, is thereby produced.

As an example, the sealing of the material engagement prior to closing the ventilation opening is checked. Material engagement defects are thereby identified promptly in a reliable manner.

In one or more embodiments, the ventilation opening is closed in a fluid-tight manner by the closure element permanently, that is to say, in a manner which cannot be released without being destroyed. It is thereby ensured that the ventilation opening in the event of (mechanical) vibrations which occur during operation is not opened in an undesirable manner. Consequently, a particularly operationally reliable and dependable fluid-tight sealing of the electronic unit is ensured.

In an appropriate development, the closure element engages behind the function carrier in a positive-locking manner in the region of the ventilation opening, for example, at the (inner) face facing the cooling member. A simple and reliable securing of the closure element to the function carrier is thereby ensured. As an example, a permanent positive-locking connection between the closure element and the function carrier is produced.

A "positive-locking engagement" or a "positive-locking connection" between at least two components which are connected to each other is intended to be understood in this instance and below to mean that the retention of the components which are connected to each other is carried out in at least one direction by means of a direct mutual engagement or rear engagement of contours of the components themselves or by means of an indirect, mutual engagement or rear engagement via an additional connection component. The "blocking" of a mutual movement in this direction is thus carried out in a shape-related manner.

In another embodiment, the closure element is constructed as a plastics material component, such as an injection-molded component. The same plastics material is used as is used to produce the function carrier so that the function carrier and the closure element have the same thermal expansion. The closure element is provided with at least one sealing ring (O-ring) which seals the closure element in a fluid-tight manner with respect to an inner wall of the ventilation opening. The ventilation opening may include a sealing seat on the inner wall of which the sealing ring is in abutment in a sealing manner. A relatively cost-effective and simple closure element is thereby produced, which contributes to a reduction of the production and assembly costs of the electronic unit.

In one or more embodiments, for example, it is conceivable for the at least one sealing ring in addition to the sealing action to also bring about an axial pretensioning of the closure element in the ventilation opening. With such an application a sealing ring (O-ring) for axial pretensioning and at least one additional sealing ring that may act primarily in a fluid-tight, sealing manner are provided on the closure element. A relatively stable securing of the closure element is thereby enabled, whereby the fluid-tight sealing action in the ventilation opening is further improved.

In another embodiment, the closure element is constructed as a longitudinal section in a substantially T-shaped manner, wherein at the free end of the vertical T leg a tool receiving member for a tool is provided. The tool receiving member may be constructed as a hexalobular socket, or as a torx recess. The horizontal T leg of the closure element is in this instance constructed for a positive-locking engagement behind the function carrier in the region of the ventilation hole. A suitable closure element for sealing the ventilation hole is thereby produced.

Suitably, in this instance at least one sealing ring is arranged along the vertical T leg. In an advantageous embodiment, for example, two O-rings for fluid-tight sealing of the closure element with respect to the inner wall and an additional O-ring for axial pretensioning are arranged in a state distributed along the vertical T leg.

As an example, the function carrier has in the region in which it is engaged from the rear two introduction ramps and two stops for the horizontal T leg which are arranged in an alternating manner, that is to say, in turn, around the ventilation opening. The introduction ramps and the stops protrude in this instance axially upward with respect to the function carrier. This means that the introduction ramps and the stops project beyond the function carrier axially, such as in the direction of the cooling member.

The introduction ramps and the stops are constructed as a counter-piece with respect to the horizontal T legs of the closure element. In another embodiment, there is provision for the closure element to be rotated for securing about the longitudinal axis thereof. In order to rotate the closure element, a tool which engages in the tool receiving member may be used. The closure element is in this instance may be rotated through 90°, wherein the horizontal T leg slides over the introduction ramps and engages or locks in a positive-locking manner between the introduction ramps and the stops in the manner of a bayonet closure. As a result, a dependable and operationally reliable securing of the locking element to the function carrier is produced. During operation, consequently, a fluid-tight closure of the ventilation opening is always ensured.

In this instance, the stops suitably prevent the closure element from being rotated further beyond 90°, whereby a defined end position of the horizontal T leg and consequently the closure element is ensured. The positive-locking connection thereby formed cannot thereby be independently released.

In an alternative, the closure element has two flexible, that is to say, at least to a degree resilient, snap-fit members which are provided at the free-end side with a respective snap hook head. In the joined or mounted state, the snap hook heads engage behind the function carrier in the region of the ventilation opening in a positive-locking manner.

In this embodiment, the closure element is pressed into the ventilation opening. As a result of the application of the pressing or joining pressure, the snap-fit members are guided along the inner wall of the ventilation opening and at least partially bent toward each other. As a result of the restoring forces which are consequently active, the snap hook heads are moved in the region of the opening of the ventilation opening independently into a locking position. A simple plug-type assembly of the closure element is thereby enabled and may provide a relatively rapid and easy closure of the ventilation opening.

The electronic unit which is described above is part of an electric fluid pump of a motor vehicle. The electronic unit is in this instance coupled to an electric motor which during operation drives a pump mechanism in order to convey a fluid.

The fluid pump may be an electromotive auxiliary or supplementary pump for a motor vehicle, such as an oil pump for lubricating gear components of a vehicle transmission. The fluid which is conveyed may be oil, for example ATF oil (Automatic Transmission Fluid), and is also used, for example, to cool the components or additional components of a drive train of such a motor vehicle. The term oil is in this instance in particular not intended to be understood to be limiting to mineral oils. Instead, a completely synthetic or partially synthetic oil, a silicone oil or other oil-like fluids, such as, for example, a hydraulic fluid or a cooling lubricant, can also be used. Alternatively, the fluid pump is, for example, constructed as a water pump.

As a result of the electronic unit according to the present disclosure, the pump or motor electronic assembly which is arranged in a fluid-tight manner therein is retained in a dependable and operationally reliable manner. As a result of the fully hardened fluid seal and the closure element, leakages are reliably prevented even at high temperatures.

The substantially plug-like closure element according to one or more embodiments may be suitable and configured for fluid-tight closure of a ventilation opening of an electronic unit described above.

BRIEF DESCRIPTION OF THE DRAWINGS

Embodiments of the invention are explained in greater detail below with reference to the drawings, in which.

Components and dimensions which mutually correspond are always given the same reference numerals in all the Figures.

DETAILED DESCRIPTION

As required, detailed embodiments of the present invention are disclosed herein; however, it is to be understood that the disclosed embodiments are merely exemplary of the invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

In order to seal a function carrier with respect to a cooling member and in order to prevent leakages, for example, it is possible to use a fluid seal (surface seal). With such a fluid seal, a fluid sealing or casting compound is applied to the abutment or contact faces between the function carrier and the cooling member. As a result of the fluid form of the sealing compound, roughness depths and structural deviations of the contact faces are filled and compensated for. The sealing compound is subsequently hardened in a hardening process, for example, in a climate chamber in the case of thermal hardening, that is to say, solidified, whereby a complete material engagement is brought about between the contact faces.

A "material engagement" or "materially engaging connection" between at least two components which are connected to each other is intended to be understood in this instance and below in particular to mean that the components which are connected to each other are held together at their contact faces by means of material association or cross-linking (for example, as a result of atomic or molecular bonding forces), where applicable under the action of an additive.

The material engagement consequently prevents the penetration of fluids into the electronic unit and ensures a reliable sealing. In addition, the seal which is thereby formed bonds on both contact faces, whereby a fixed (adhesive) connection between the function carrier and the cooling member is brought about. That is to say, such a fluid seal serves both to seal and to join the electronic unit.

In the case of a completely closed electronic unit, however, the problem occurs in this instance that the sealing compound after a hardening process does not fully or completely harden. Both the sealing and the joining properties of the material engagement or the adhesive connection are thereby reduced in a disadvantageous manner, whereby the risk of leakages of the electronic unit is significantly increased.

Figure 1:
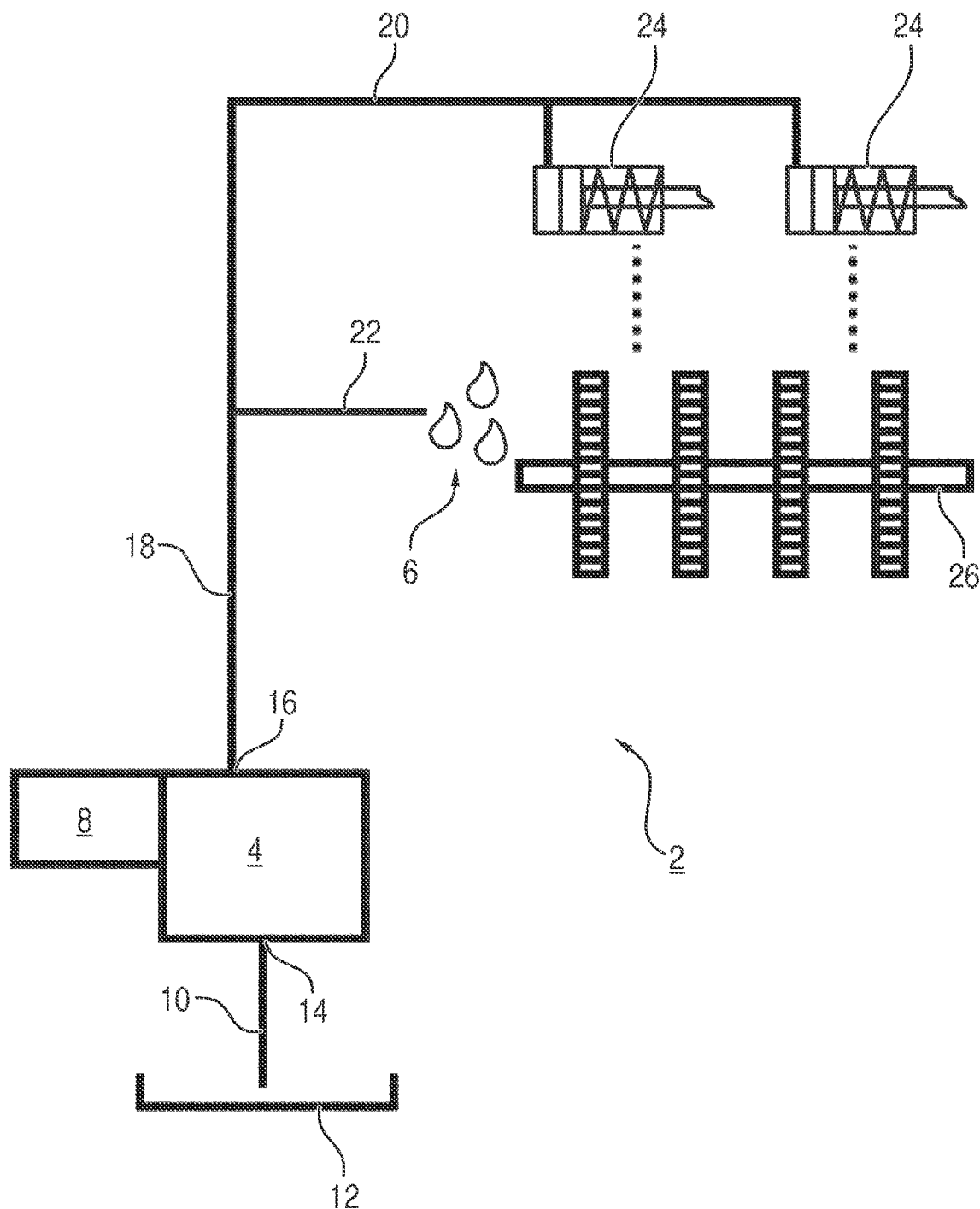
FIG. 1 is a schematic and simplified illustration of an oil circuit of a motor vehicle having an electromotive oil pump.

FIG. 1 is a schematic and simplified illustration of a part-region of an oil circuit 2 of a motor vehicle which is not shown in greater detail. The oil circuit 2 comprises an electrical or electromotive fluid pump 4 as a combined main oil pump and an auxiliary or supplementary pump for conveying a fluid 6, in particular a (lubricant) oil to gear components of a vehicle transmission.

The fluid pump 4 which is also referred to below as an oil pump has an electric motor 8 as an electric drive machine. During operation of the electric motor 8 or the oil pump 4, the oil 6 is drawn by means of a reduced pressure line 10 from an oil sump 12 via a (pump) inlet 14 and pumped via a (pump) outlet 16 into an oil line 18 which is divided into a main oil line 20 and an auxiliary or additional line 22.

The main oil line 20 forms a main oil circuit of the oil circuit 2 and may be provided to supply and activate hydraulic transmission actuators 24 by means of which, for example, the gears of a transmission arrangement 26 of a vehicle transmission which may be an automatic transmission or as a dual coupling transmission are engaged or shifted. The auxiliary or supplementary line 22 is accordingly in particular a component of an auxiliary or supplementary circuit for at least occasional lubrication or additional lubrication of gear components, such as, for example, of the transmission arrangement 26.

Figure 2:
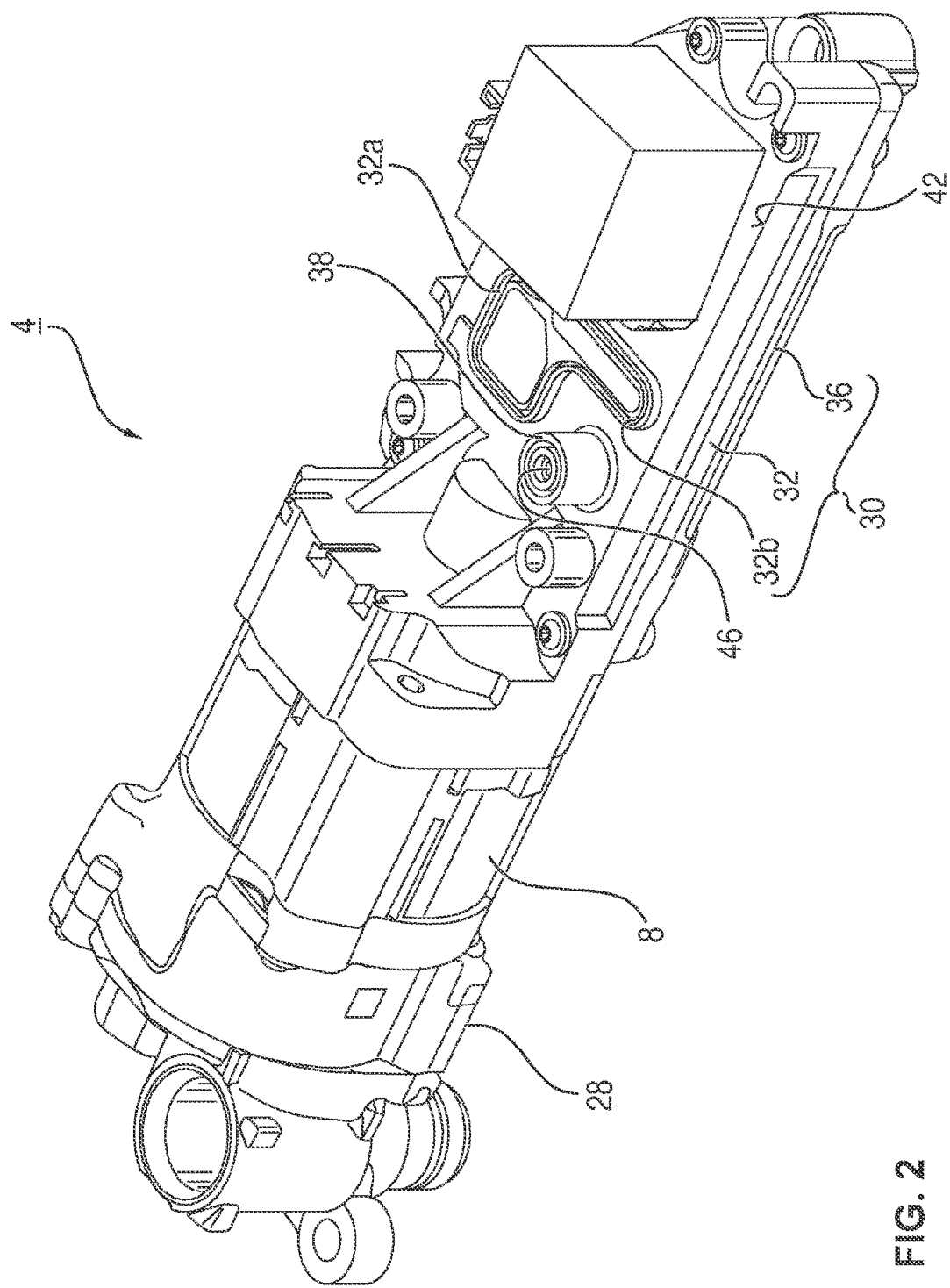
FIG. 2 is a perspective illustration of the oil pump with a pump mechanism and with an electric motor and with an electronic unit.

The oil pump 4 is shown in FIG. 2 in a comparatively detailed manner. The oil pump 4 comprises a pump housing 28 having a pump mechanism which is not shown in greater detail for conveying the oil 6. The pump mechanism is coupled to the electric motor 8 in technical drive terms. To this end, the electric motor 8 is secured at a first end side to the pump housing 28. At the end side of the electric motor 8 opposite the pump housing 28, an electronic unit 30 is provided.

Figure 3:
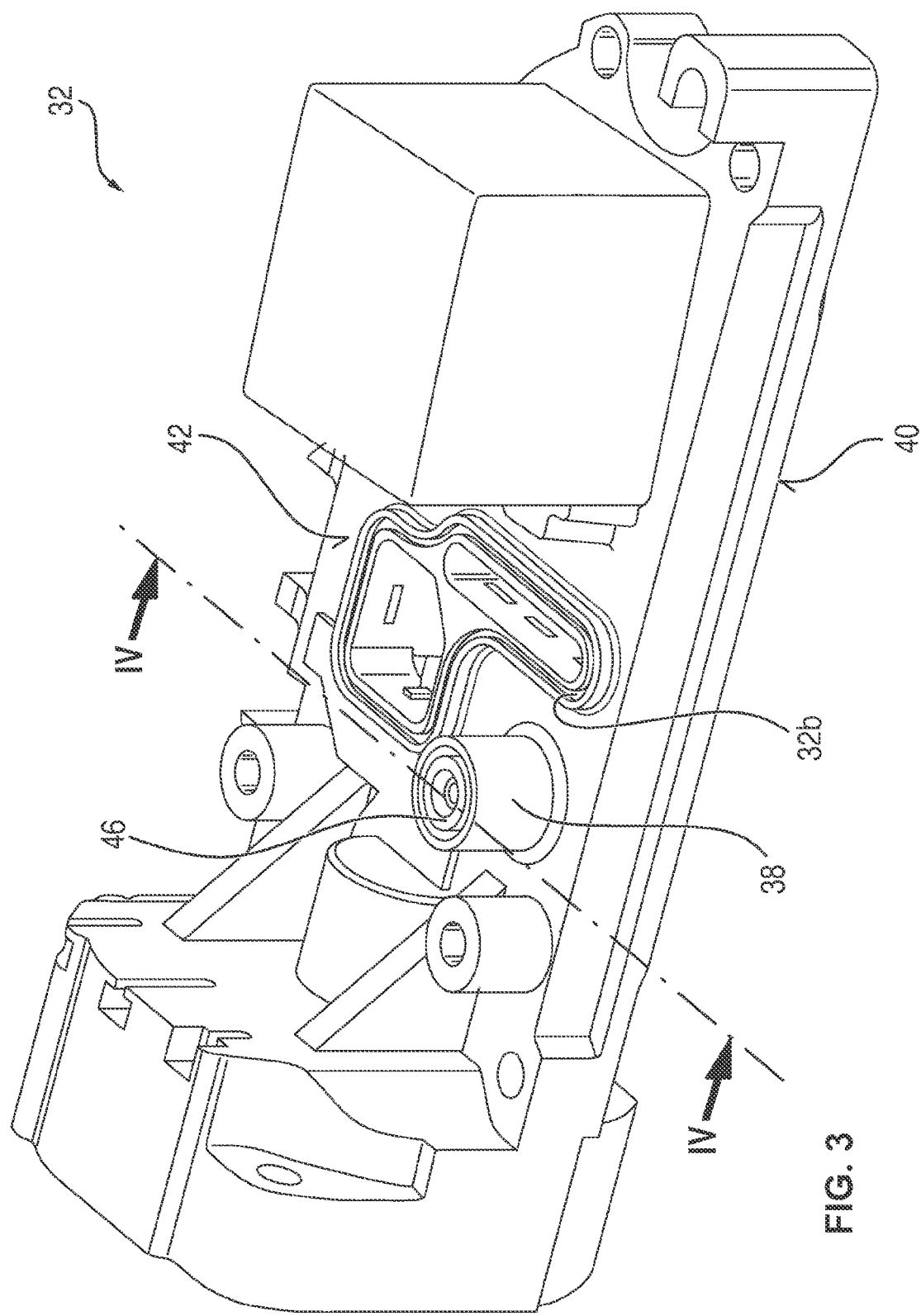
FIG. 3 is a perspective illustration of a function carrier of the electronic unit.
Figure 4:
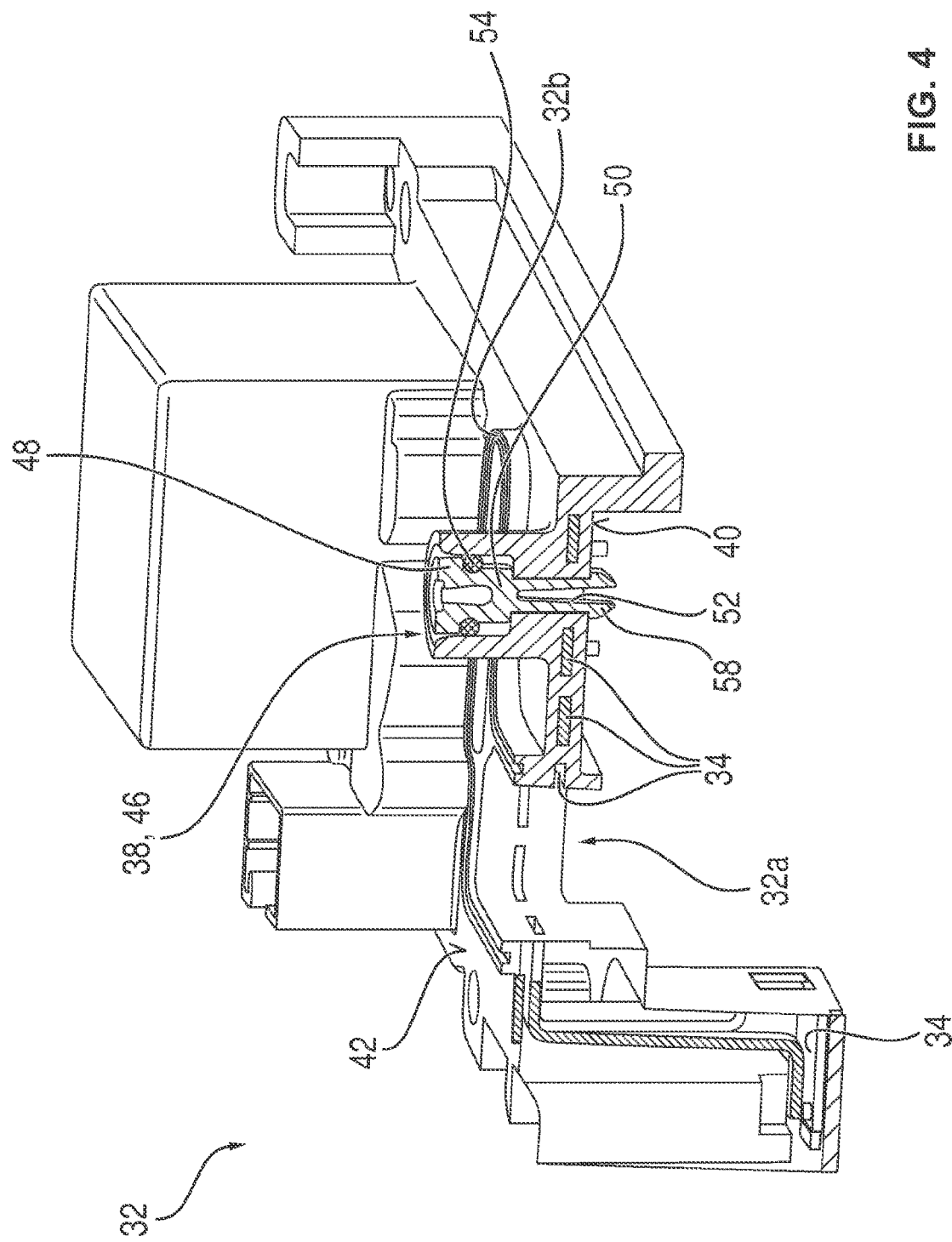
FIG. 4 is a perspective section of the electronic unit along the line IV-IV according to FIG. 3.

The electronic unit 30 has a function carrier 32 which is illustrated in detail in FIGS. 3 and 4 and which carries a (motor, pump) electronic assembly 34 for operating the machine 8. The electronic assembly 34 is shown only as a cut-out in FIG. 4 in the form of current paths (lead frames) which are integrated in the function carrier 32 and, for example, provided with reference numerals. In order to cool and protect the electronic assembly 34, it is covered with a cover-like cooling member (cooling lid) 36 in a fluid-tight manner. That is to say, the function carrier 32 and the cooling member 36 form the electronic unit 30 of the oil pump 4 which is closed in a substantially completely fluid-tight manner.

In this embodiment, the function carrier 32 is constructed as an injection-molded component from a plastics material, wherein the cooling member 36 is constructed as a metal die-cast component, for example, from an aluminum material. As an example, the cooling member 36 which acts as a heat sink has a higher thermal conductivity than the function carrier 32. For improved and effective cooling of the function carrier 32, it has two recesses 32a, 32b.

In order to ensure the highest possible level of fluid-tightness, the function carrier 32 and the cooling member 36 are joined together in a materially engaging manner by means of a fluid seal which is not shown in greater detail. To this end, a sealing compound (grouting) of the fluid seal which is constructed, for example, as an adhesive, is applied to the mutually facing, such as edge-side, that is to say, arranged on the respective external periphery, contact or abutment faces of the cooling member 32 and/or the function carrier 36. Subsequently, the cooling member 32 and the function carrier 36 are joined and the sealing compound is hardened by means of a hardening process. The material of the sealing compound is fluid or oil-resistant in this instance at least in the hardened state of the fluid seal, this means that the sealing compound with respect to contact with the oil 6 is chemically inert, that is to say, non-reactive.

In order to ensure the most complete hardening of the sealing compound during the hardening process, the function carrier 32 has a ventilation opening 38. As can be seen in the sectioned illustration of FIG. 4, the ventilation opening 38 is in this instance constructed as a channel-like through-opening or through-hole which extends through the function carrier 32 from an inner face 40 facing the cooling member 36 to an opposing outer face 42.

Figure 5:
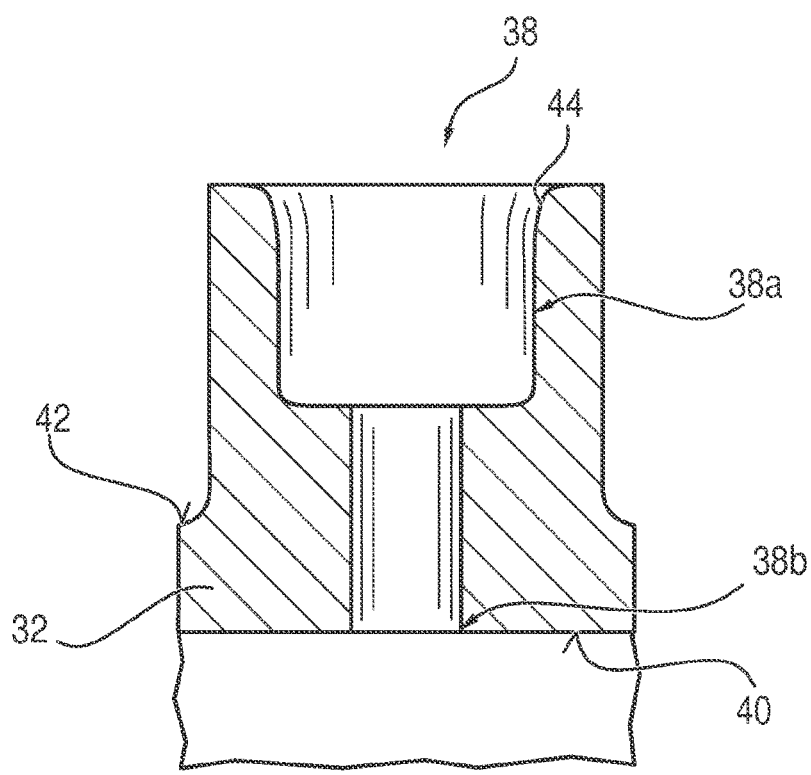
FIG. 5 is a sectioned illustration of a ventilation opening of the function carrier in a first embodiment.

The ventilation opening 38 which is illustrated in detail in FIG. 5 has a collar or pipe portion which protrudes axially in an upward direction from the outer face 42 and which is not shown in greater detail. The ventilation opening 38 has an introduction region 38a and a retention region 38b which opens therein and which leads to the inner face 40. The introduction region 38a is provided at the upper, that is to say, the outer end thereof with a chamfered introduction member 44. The retention region 38b has in comparison with the introduction region 38a a reduced clear width, that is to say, a smaller radial diameter.

The ventilation opening 38 is open during the hardening process, this means that the electronic unit 30 is not completely closed during the hardening process of the fluid seal. For subsequent complete fluid-tight sealing of the electronic unit 30 and in order to prevent leakages, the ventilation opening 38 is connected in a fluid-tight manner to a closure element 46 after the hardening process.

Figure 6:
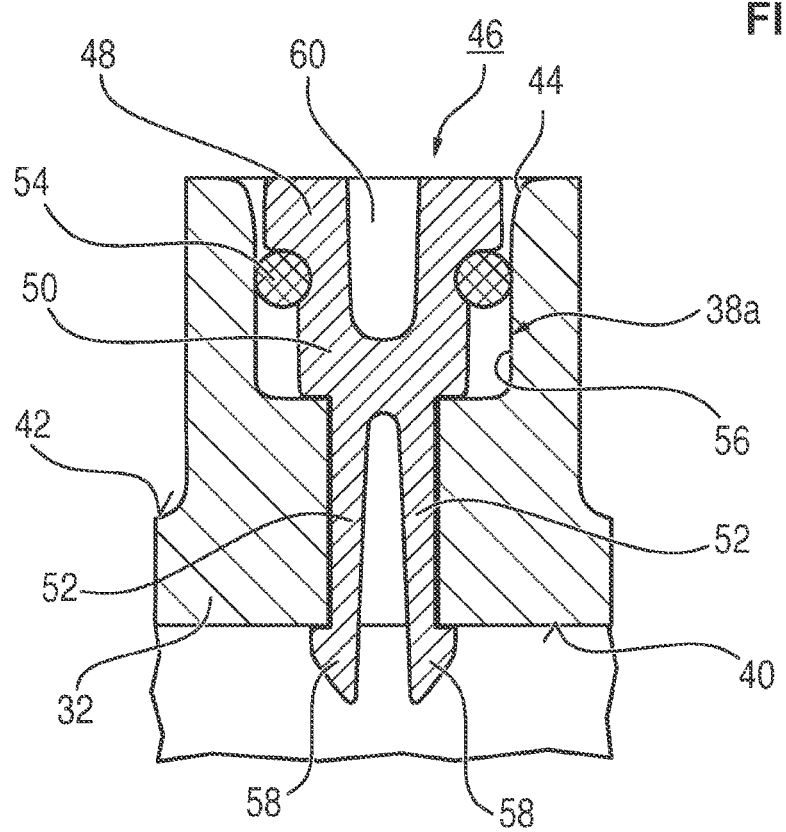
FIG. 6 is a sectioned illustration of the ventilation opening with an inserted closure element in a first embodiment.

As can be seen in the sectioned illustrations of FIG. 4 and FIG. 6, the closure element 46 is located in this instance substantially completely in the ventilation opening 38.

Figure 7:
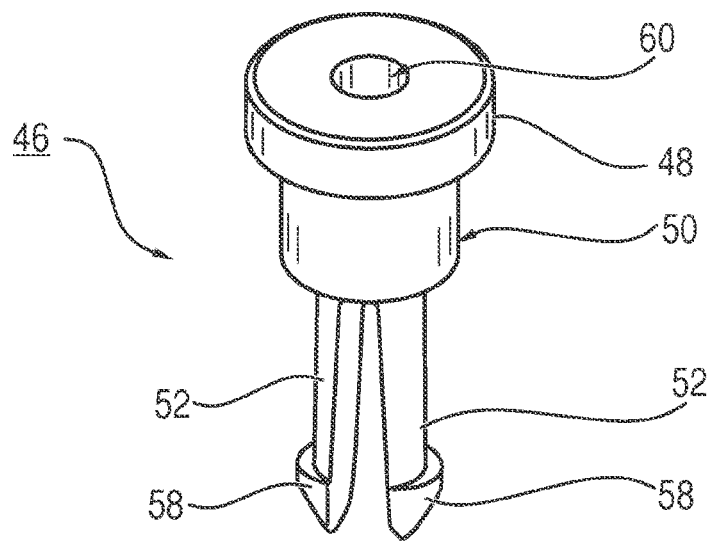
FIG. 7 is a perspective illustration of the closure element.
Figure 8:
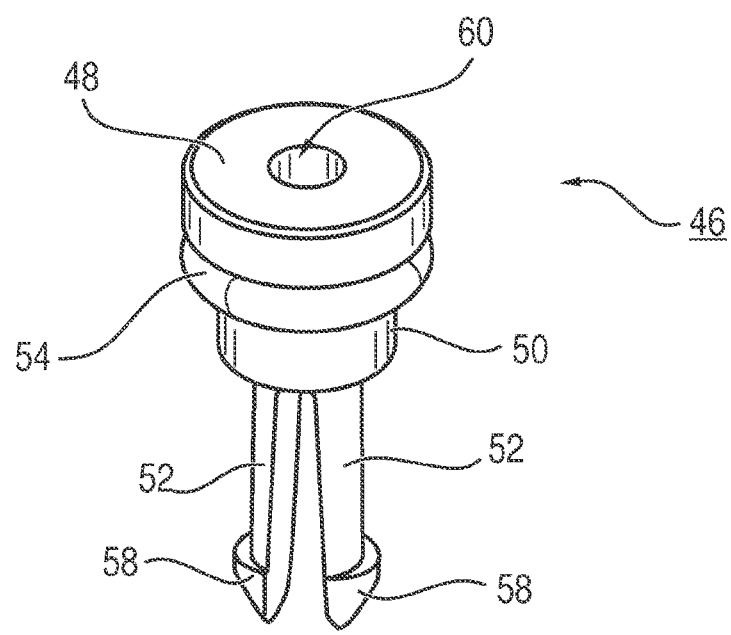
FIG. 8 is a perspective illustration of the closure element with a sealing ring.

The closure element 46 illustrated in detail in FIG. 7 and in FIG. 8 has a closure head 48 and a retention seat 50 and two snap-fit members 52 which are constructed as a one-piece, that is to say, integral or monolithic injection molded component. The closure element 46 is in this may be produced from the same plastics material as the function carrier 32.

The cylindrical retention seat 50 is formed on the substantially annular closure head 48, wherein the closure head 48 protrudes radially beyond the retention seat 50 toward the outer periphery thereof. As can be seen, for example, in FIG.

6, the closure head 48 has a diameter which substantially corresponds to the clear width of the introduction region 38*a* of the introduction opening 38.

As shown, for example, in FIG. 6 and FIG. 8, a resilient sealing ring (O-ring) 54 is fitted to the retention seat 50. In the assembled or joined state (FIG. 6, FIG. 8) of the closure element 46 in the ventilation opening 38, the sealing ring 54 is in abutment in a fluid-tight manner with an inner wall 56 of the introduction region 38*a* which is also referred to below as a sealing seat. The sealing ring 54 may be produced from a fluid or oil-resistant material so that in the assembled state of the closure element 46 a dependable and operationally reliable fluid-tight sealing of the ventilation opening 38 is ensured.

The sealing ring 54 which is placed on the retention seat 50 is oversized with respect to the sealing seat 38*a* of the introduction opening 38. As an example, the sealing ring 54 has a greater radial width than the plug-like closure head 48. When the closure element 46 is inserted into the ventilation opening 38, as a result of the resilience of the sealing ring 54, a clamping and sealing abutment of the sealing ring 54 against the retention seat 50, on the one hand, and the inner wall 56 of the sealing seat 38*a*, on the other hand, is ensured. The ventilation opening 38 is thereby closed in a reliable fluid-tight manner by the closure element 46.

In order to prevent the closure element 46 from sliding out of the ventilation opening 38 in an undesirable manner, the two snap-fit or joining members 52 are formed on the retention seat 50 of the closure element 46. The snap-fit members 52 are as a result of their shape and/or material constructed to be at least partially flexible, that is to say, at least to some degree resilient. The snap-fit members 52 are provided in each case at the free end side, that is to say, at a member end or free end facing away from the retention seat 50, with a projection-like snap hook head 58.

In order to facilitate the insertion or pressing of the closure element 46 into the ventilation opening 38, the closure element 46 has a blind-hole-like receiving member 60. The receiving member 60 is in this instance introduced as a central annular opening in the closure head 48 and extends at least partially axially into the retention seat 50. During assembly, for example, it is possible for a stamp to engage in the receiving member 60 and to thereby press the closure element 46 axially into the ventilation opening 38, wherein the chamfered introduction member 44 of the sealing seat 38*a* in this instance may enable a relatively simple and reliable introduction of the closure element 46.

As a result of the application of the pressing or joining pressure, the snap-fit members 52 are guided along an inner wall of the retention region, and in this instance at least partially bent toward each other. As a result of the restoring forces which are consequently active, the snap hook heads 58 when emerging at the inner face 40 in the region of the ventilation opening 38 are independently moved into a locking position. That is to say, the snap hook heads 58 engage in the joined or assembled state behind the function carrier 32 in the region of the ventilation opening 38 in a positive-locking manner (FIG. 6). A plug-type securing of the closure element 46 with reduced complexity is thereby produced and closes the ventilation opening in a fluid-tight manner permanently, that is to say, in a manner which cannot be released without being destroyed.

With reference to FIGS. 9 to 16, a second embodiment of the closure element 46' with a second embodiment of the ventilation opening 38' which is adapted thereto is illustrated in greater detail below.

Figure 9:
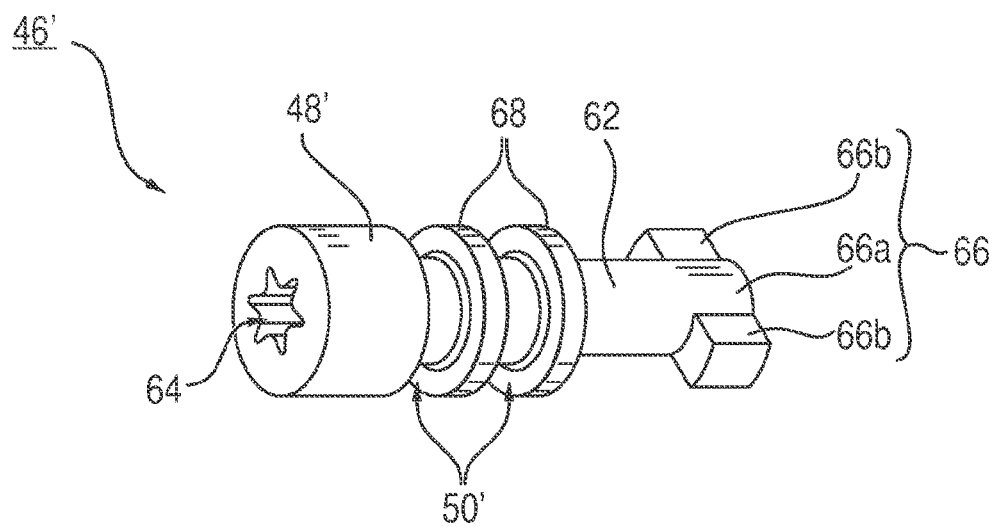
FIG. 9 is a perspective illustration of a second embodiment of a closure element.
Figure 10:
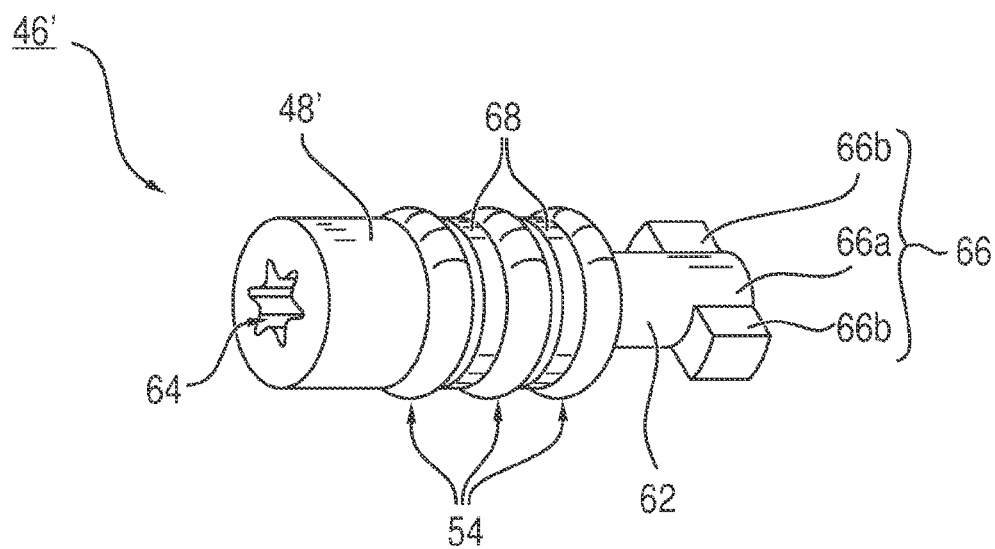
FIG. 10 is a perspective illustration of the closure element according to FIG. 9 with three sealing rings.
Figure 15:
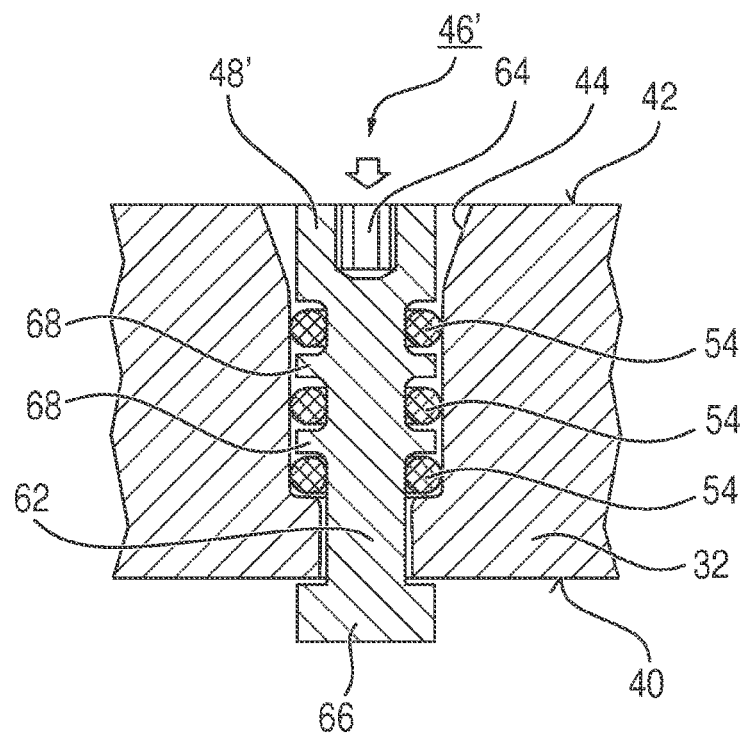
FIG. 15 is a sectioned illustration of the ventilation opening with the inserted closure element in the second embodiment.

In this embodiment, the closure element 46' which is illustrated in detail in FIG. 9 and in FIG. 10 is constructed to be substantially T-shaped in a longitudinal section (FIG. 15).

The vertical T leg 62 extends in this instance in the joined or assembled state in the axial direction, that is to say, along the center axis, of the ventilation opening 38'. The closure head 48' in which a central tool receiving member 64 is formed is formed on the free end of the T leg 62. The tool receiving member 64 is in this instance constructed as a hexalobular socket.

At the end of the T leg 62 opposite the tool receiving member 64, the horizontal T leg 66 of the closure element 46' which extends transversely relative thereto is formed. The T leg 66 has a substantially cylindrical center region 66*a* which is constructed as a continuation of the T leg 62. At the central region 66*a*, two transversely orientated and mutually diametrically opposed arms 66*b* are arranged. The two arms 66*b* of the T leg 66 which protrude over the T leg 62 are in this instance constructed to engage behind the function carrier 32 in the region of the ventilation hole 38' in a positive-locking manner.

As shown in FIG. 9, the closure element 46' has two retention plates 68 which are formed in an axially distributed manner in the T leg 62. As a result of the retention plate 68, three retention seats 50' are formed along the T leg 62, wherein a sealing ring 54 is provided in each case for the respective retention seat 50' (FIG. 10).

With reference to FIGS. 11 to 14, the structure of the ventilation opening 38' which is constructed to complement the closure element 46' is explained in greater detail below.

Figure 11:
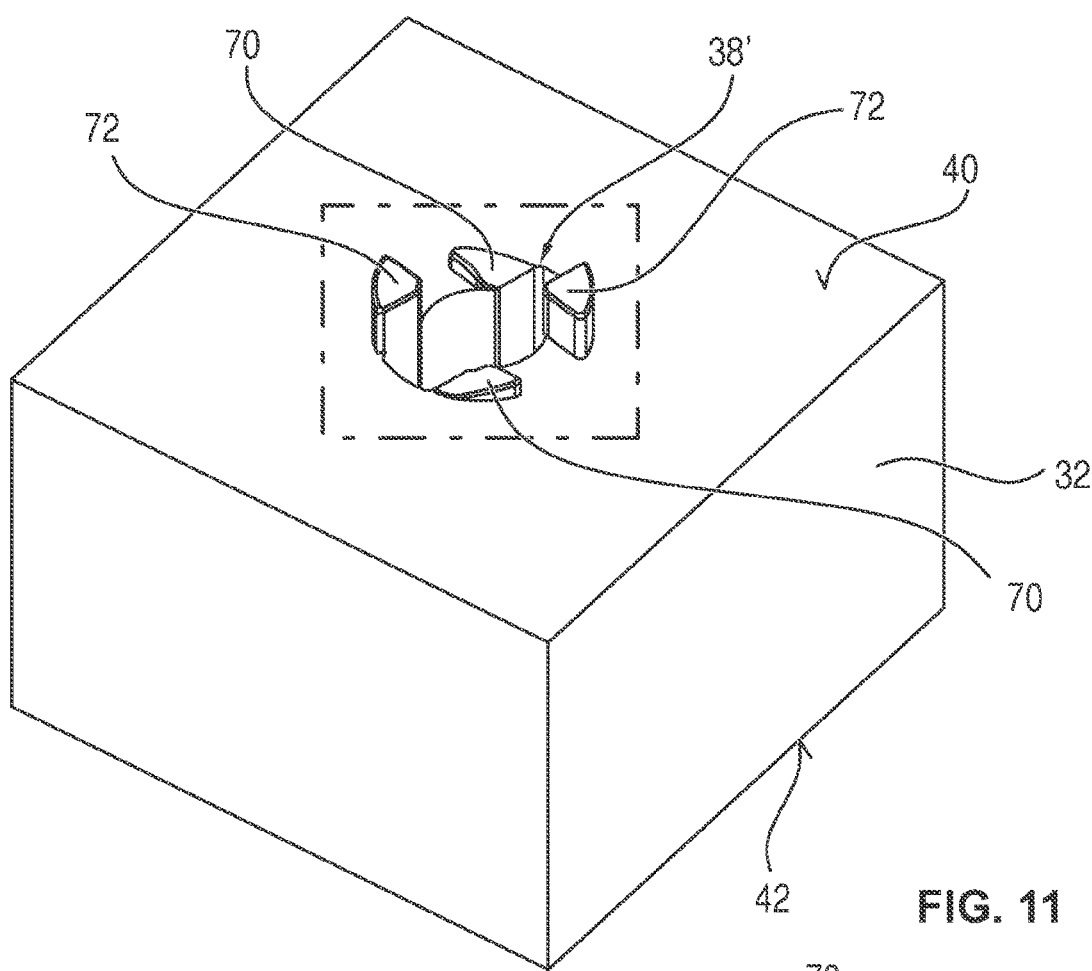
FIG. 11 is a perspective cut-out of the function carrier in the region of the ventilation opening according to a second embodiment.
Figure 12:
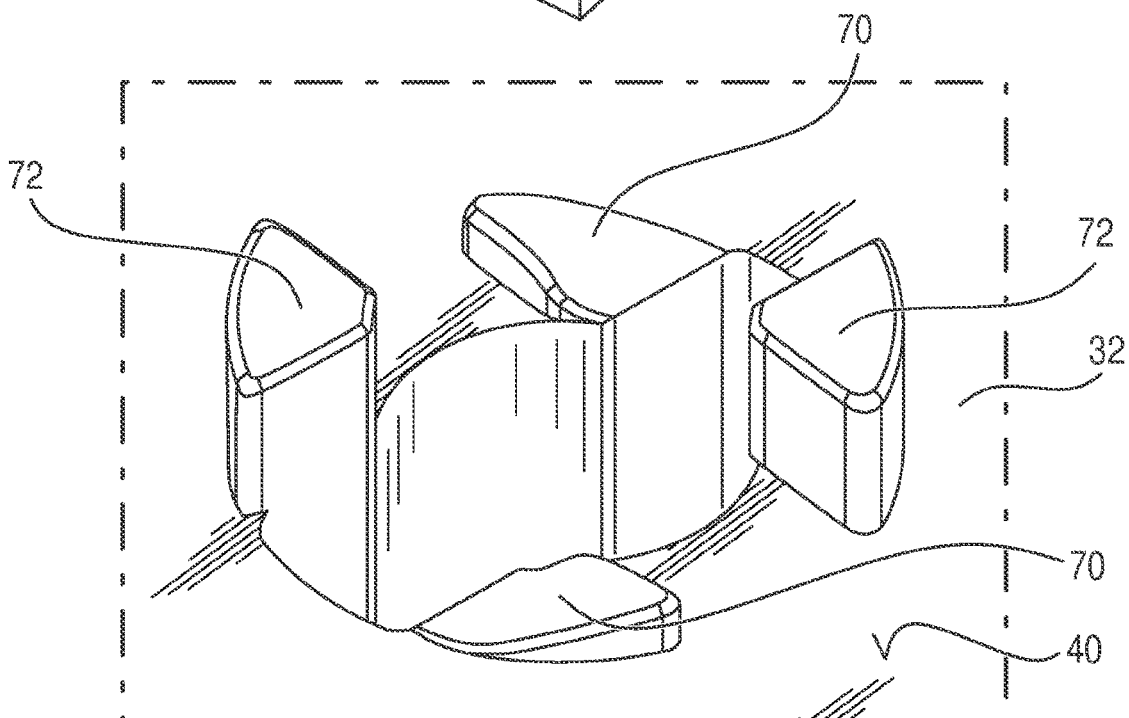
FIG. 12 is a perspective cut-out of the region of the ventilation opening.
Figure 13:
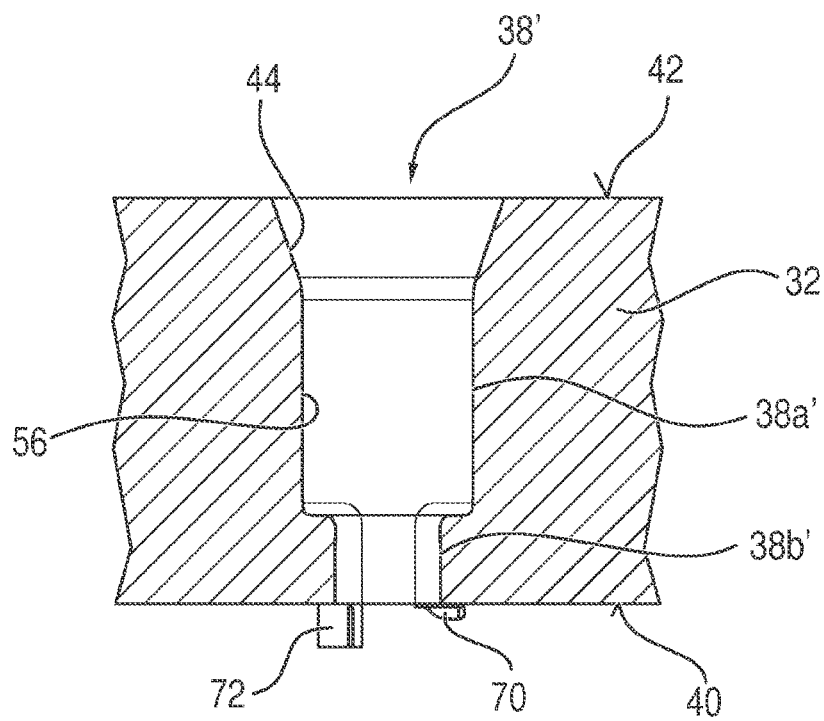
FIG. 13 is a sectioned illustration of the ventilation opening.

FIG. 11 shows a cut-out of the function carrier 32 in the region of the ventilation opening 38', with a view of the inner face 40, wherein this region is illustrated to a larger scale in FIG. 12.

Figure 14:
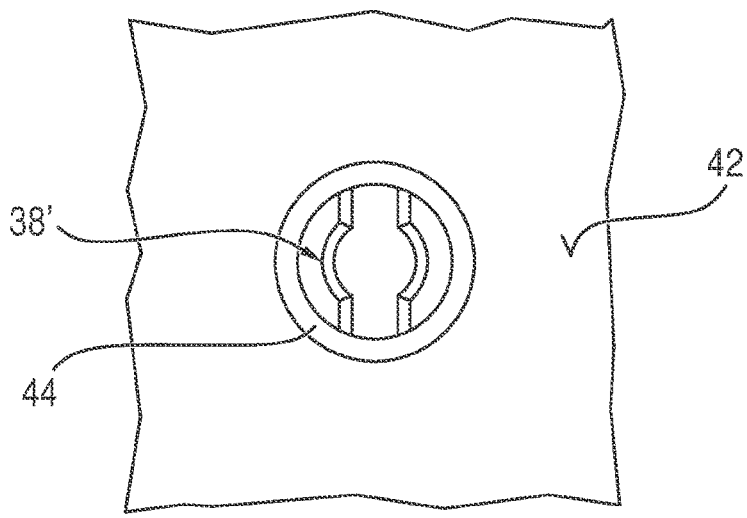
FIG. 14 is a plan view of the ventilation opening.

The opening of the retention region 38*b*' of the ventilation opening 38' facing the inner face 40 has in this embodiment—as can be seen in particular in FIG. 12 and FIG. 14—a cross-sectional shape which is adapted to the outer contour of the T leg 66. That is to say, the T leg 66 during an assembly or joining method can be guided substantially in a precisely fitting manner through the retention region 38*b*' to the inner face 40.

The inner face 40 of the function carrier 32 has in this region, behind which the arms 66*b* of the T leg 66 engage in the assembly or joined state, two introduction ramps 70 and two stops 72 which are arranged alternately, that is to say, in turn, about the ventilation opening 38'.

The introduction ramps 70 and the stops 72 protrude axially in an upward direction from the inner face 40 of the function carrier 32, wherein the stops 72 have a greater axial height than the introduction ramps 70. The introduction ramps 70 have a running face which is not depicted in greater detail and which extends at an angle inclined with respect to the inner face 40. The introduction ramps 70 and the stops 72 are in this instance arranged in the region of the (shaping) opening of the ventilation opening 38' which corresponds to the arms 66*b*.

Figure 16:
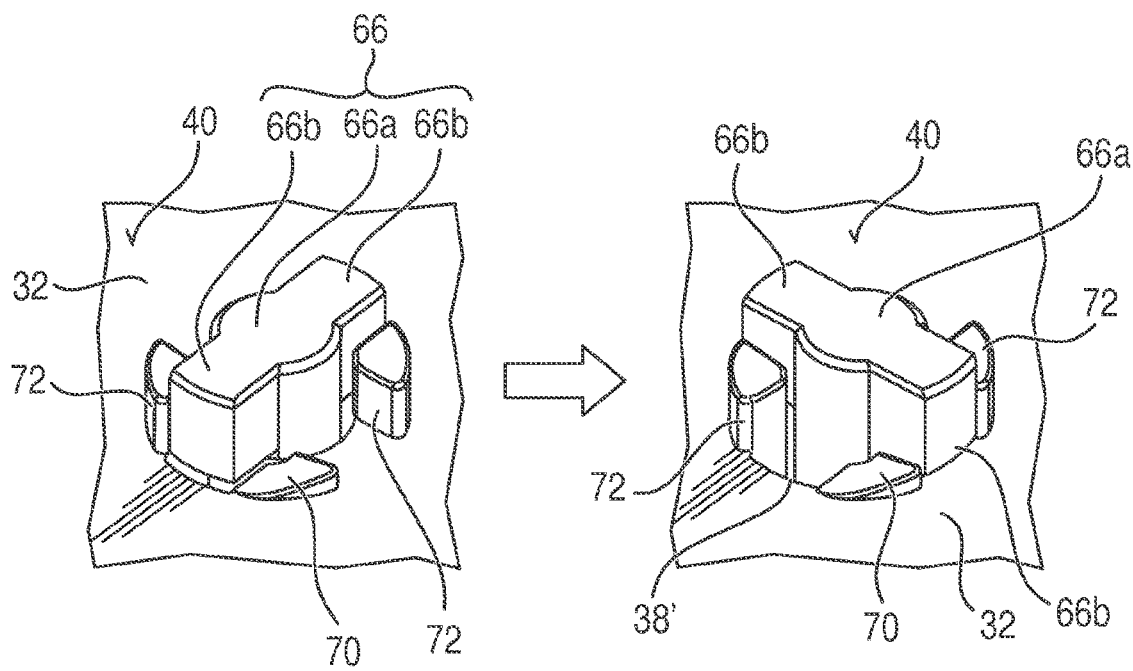
FIG. 16 shows in successive individual illustrations a securing of the closure element in the ventilation opening in the manner of a bayonet closure.

As shown in particular in FIGS. 15 and 16, in order to assemble or join the closure element 46' in the ventilation opening 38' there is provision for the closure element 46' to be pressed into the ventilation opening 38' and subsequently rotated about the longitudinal axis thereof. In order to rotate the closure element 46', in this instance in particular a tool which is not illustrated in greater detail and which engages in the tool receiving member 64 is used.

The closure element 46' is in this instance rotated through 90°, wherein the arms 66b of the T leg 66 are guided over the introduction ramps 70. The T leg 66 and consequently the closure element 46' is thereby axially raised with respect to the inner face 40, the closure element 46' is thus drawn to some degree further into the ventilation opening 38'. In this instance, in particular the sealing ring 54 which is arranged next to the T leg 66 brings about an axial pretensioning of the closure element 46'. At the end of the respective introduction ramp 70, the T leg is moved back to the inner face 40 as a result of this pretensioning.

The rotational movement is blocked by the stops 72 so that the T leg 66 engages or locks in a positive-locking manner in the manner of a bayonet closure between the introduction ramps 70 and the stops 72. As an example, the T leg 66 and consequently the closure element 46' is consequently permanently fixed in a positive-locking manner to the function carrier 32.

Figure 17:
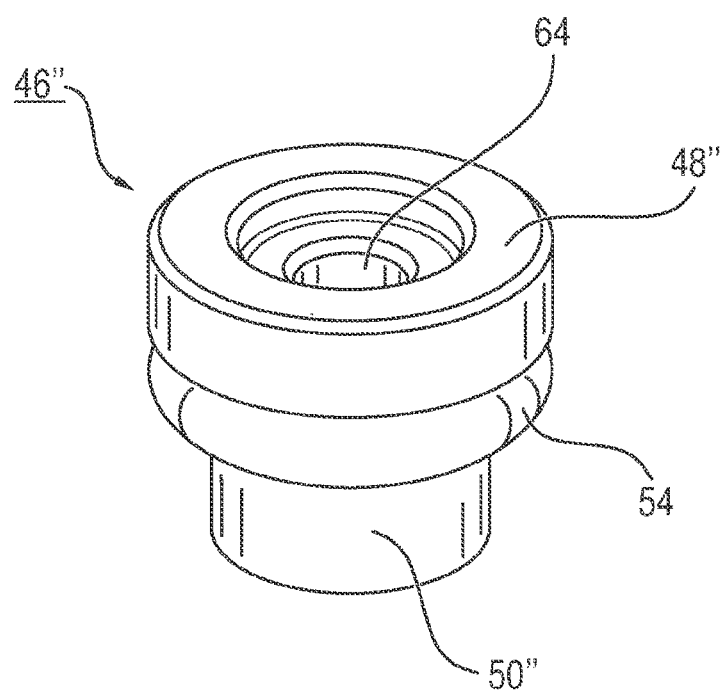
FIG. 17 is a perspective illustration of a third embodiment of the closure element.

FIG. 17 shows a third embodiment of the closure element 46". The closure element 46", which is configured in a substantially T-shaped manner in an axial section, has a closure head 48" having a central tool receiving member 64. A retention seat 50" for a sealing ring 54 is formed on the closure head 48".

In contrast to the above-described embodiments of the closure elements 46 and 46', the closure element 46" has no additionally formed fixing elements (snap hooks, bayonet). In other words, it is constructed without fixing elements and consequently has a particularly simple and cost-effective structure. The securing of the closure element 46" in order to close a corresponding ventilation opening in a fluid-tight manner is carried out in this instance only by means of the resilient pretensioning of the sealing ring 54 which is fitted to the retention seat 50".

The invention is not limited to the embodiments described above. Instead, other variants of the invention can also be derived therefrom by the person skilled in the art without departing from the subject-matter of the invention. In particular, all individual features described in connection with the embodiments can also be combined with each other in another manner without departing from the subject-matter of the invention.

The following is a list of reference numbers shown in the Figures. However, it should be understood that the use of these terms is for illustrative purposes only with respect to one embodiment. And, use of reference numbers correlating a certain term that is both illustrated in the Figures and present in the claims is not intended to limit the claims to only cover the illustrated embodiment.

LIST OF REFERENCE NUMERALS

2 Oil circuit
4 Fluid pump/oil pump
6 Fluid/oil
8 Electric motor
10 Reduced pressure line
12 Oil sump
14 Inlet
16 Outlet
18 Oil line
20 Main oil line
22 Auxiliary line/supplementary line
24 Transmission actuator
26 Transmission arrangement
28 Pump housing
30 Electronic unit
32 Function carrier
32a, 32b Recess
34 Electronic assembly
36 Cooling member
38, 38' Ventilation opening
38a, 38a' Introduction region/sealing seat
38b, 38b' Retention region
40 Inner face
42 Outer face
44 Chamfered introduction member
46, 46', 46" Closure element
48, 48', 48" Closure head
50, 50', 50" Retention seat
52 Snap-fit member
54 Sealing ring
56 Inner wall
58 Snap hook head
60 Receiving member
62 T leg
64 Tool receiving member
66 T leg
66a Central region
66b Arm
68 Retention plate
70 Introduction ramp
72 Stop While exemplary embodiments are described above, it is not intended that these embodiments describe all possible forms of the invention. Rather, the words used in the specification are words of description rather than limitation, and it is understood that various changes may be made without departing from the spirit and scope of the invention. Additionally, the features of various implementing embodiments may be combined to form further embodiments of the invention.

The invention claimed is:

1. An electronic unit for use in an electric fluid pump for a motor vehicle, the electronic unit comprising:
   an electronic assembly;
   a function carrier retaining the electronic assembly and including a ventilation opening;
   a cooling member disposed on the function carrier, wherein the function carrier and the cooling member are sealed with respect to each other in a fluid-tight manner by means of a fluid seal formed of a hardened sealing compound; and
   a closure element, wherein during a hardening process to harden the sealing compound, the ventilation opening is open, wherein after the hardening process, the closure element closes the ventilation opening, wherein the closure element includes a free end and two flexible snap-fit members extending therefrom, and wherein each of the two flexible snap-fit members include a snap hook head that engage an inner surface of the function carrier.

2. The electronic unit of claim 1, wherein the closure element is configured to permanently close the ventilation opening in a fluid-tight manner.

3. The electronic unit of claim 1, wherein the function carrier includes an outer face and an inner face and the closure element extends through the outer face and the inner face and engages a region of the inner face covered by the ventilation opening.

4. The electronic unit of claim 1, wherein the closure element is formed of a plastic material and includes a sealing ring configured to seal the closure element in a fluid-tight manner with respect to an inner wall of the ventilation opening.

5. The electronic unit of claim 1, wherein the closure element has a substantially T-shaped cross section and includes a vertical T leg and a horizontal T leg, wherein a free end of the vertical T leg defines a tool receiving member, and wherein the horizontal T leg engages in a positive-locking manner an inner surface of the function carrier spaced apart from the ventilation opening.

6. The electronic unit of claim 5, wherein the inner surface defines two introduction ramps and two stops extending axially from the inner surface and collectively arranged in an alternating manner about the ventilation opening and configured to engage the horizontal T leg.

7. The electronic unit of claim 6, wherein the closure element extends along a longitudinal axis and is configured to be rotated about the longitudinal axis thereof so that the horizontal T leg slides over the introduction ramps and engages the stops in a positive-locking manner.

8. An electric fluid pump for use in a motor vehicle transmission, the electric fluid pump comprising:
 an electric motor; and
 an electronic unit coupled to the electric motor and including,
  a function carrier defining a ventilation opening,
  a cooling member fixed to the function carrier by a sealing compound, wherein the sealing compound is configured to harden after a period, and
  a closure element provided with a sealing ring, wherein the closure element is inserted into the ventilation opening so that the ventilation opening is closed after the sealing compound hardens, wherein the closure element includes a free end and two flexible snap-fit members extending therefrom, and wherein each of the two flexible snap-fit members include a snap hook head that engage an inner surface of the function carrier.

9. The electronic unit of claim 4, wherein the closure element is formed by injection molding.

10. The electric fluid pump of claim 8, wherein the closure element is formed of a plastic material.

11. The electric fluid pump of claim 8, wherein the function carrier includes an outer face and an inner face opposing the inner face and fixed to the cooling member, wherein the closure element extends through the outer face and the inner face.

12. The electric fluid pump of claim 11, wherein the closure element includes a first end and a second end provided with a retention member configured to engage a portion of the inner surface of the function carrier.

13. The electric fluid pump of claim 12, wherein the function carrier includes a protrusion extending from the outer face, wherein the protrusion defines a first axial portion of the ventilation opening and the sealing ring is disposed in the first axial portion.

14. The electric fluid pump of claim 13, wherein the first end of the closure element includes a head and the sealing ring lies against the head.

15. The electric field pump of claim 14, wherein the head defines a socket configured to receive a tool.

16. The electric fluid pump of claim 11, wherein the retention member includes a tapered locking tab.

17. An electric fluid pump for use in a motor vehicle transmission, the electric fluid pump comprising:
 an electric motor; and
 an electronic unit coupled to the electric motor and including,
  a function carrier including an inner side and an outer side collectively defining a ventilation aperture,
  a cooling member fixed to the function carrier by a sealing compound, wherein the sealing compound is configured to harden after a period, and
  a closure element extending through the ventilation aperture and including a body provided with first end and a second end, wherein a portion of the second end engages the inner side of the function carrier to fix the closure element to the function carrier, wherein the closure element includes a free end and two flexible snap-fit members extending therefrom, and wherein each of the two flexible snap-fit members include a snap hook head that engage an inner surface of the function carrier.

18. The electric fluid pump of claim 17, wherein the closure element is configured to rotate about a longitudinal axis and the second end includes a leg extending from the body in a direction transverse to the longitudinal axis.

19. The electric fluid pump of claim 18, wherein a portion of the inner surface includes a ramp and a stop, wherein the leg is configured to move along the ramp to clamp the body towards the inner surface and engage the engage the stop.

* * * * *